(12) United States Patent
Caresosa et al.

(10) Patent No.: US 7,034,606 B2
(45) Date of Patent: Apr. 25, 2006

(54) VGA-CTF COMBINATION CELL FOR 10 GB/S SERIAL DATA RECEIVERS

(75) Inventors: Mario Caresosa, Rancho Santa Margarita, CA (US); Afshin Momtaz, Laguna Hills, CA (US); Guangming Yin, Foothill Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/841,766

(22) Filed: May 7, 2004

(65) Prior Publication Data

US 2005/0248396 A1    Nov. 10, 2005

(51) Int. Cl.
    *G06G 7/12* (2006.01)
(52) U.S. Cl. .................. 327/563; 330/254; 330/278
(58) Field of Classification Search ........ 327/551–559; 330/254, 278–285, 310, 311, 133, 134
    See application file for complete search history.

(56) References Cited

U.S. PATENT DOCUMENTS

| | | | |
|---|---|---|---|
| 6,313,997 B1 * | 11/2001 | Speraw | 361/741 |
| 6,342,813 B1 * | 1/2002 | Imbornone et al. | 330/254 |
| 6,781,461 B1 * | 8/2004 | Fanous et al. | 330/254 |
| 6,853,249 B1 * | 2/2005 | Cyrusian | 330/253 |
| 6,891,436 B1 * | 5/2005 | Kim et al. | 330/254 |
| 2004/0013184 A1 | 1/2004 | Tonietto et al. | 375/345 |
| 2004/0028158 A1 | 2/2004 | Fujimori et al. | 375/340 |
| 2005/0024142 A1 * | 2/2005 | Sowlati | 330/254 |

OTHER PUBLICATIONS

Mohan, Sunderarajan S., et al, "Bandwidth Extension in CMOS with Optimized On-chip Inductors," IEEE Journal of Solid-State Circuits, vol. 35, No. 3, Mar. 2000, pp. 346-355.

* cited by examiner

*Primary Examiner*—Tuan T. Lam
(74) *Attorney, Agent, or Firm*—Christie, Parker & Hale, LLP (57) ABSTRACT

An input processing circuit includes a first and second input transistors for receiving a differential pair of first and second input signals, respectively. At least one resistor is coupled between first terminals of the first and second input transistors. The input processing circuit includes a variable gain amplifier (VGA) circuit. At least one first transistor has a gate terminal, and is coupled between the first terminals of the first and second input transistors. At least one second transistor has a gate terminal, and is coupled between the first terminals of the first and second input transistors. A gate switch is coupled to the gate terminal of the at least one second transistor. The at least one first transistor and the at least one second transistor adjust a gain of the input processing circuit in response to a control voltage. The control voltage is applied to the gate terminal of the at least one first transistor, and the control voltage is applied to the gate terminal of the at least one second transistor through the gate switch.

11 Claims, 10 Drawing Sheets

VGA-CTF COMBINATION CELL FOR 10 GB/S SERIAL DATA RECEIVERS

FIELD OF THE INVENTION

This application is related to variable gain amplifier (VGA) and continuous time filter (CTF) circuits used for data communications, and more particularly to a VGA-CTF combination cell for adjusting gain and bandwidth of a signal input at a front end of a high speed, serial communication receiver.

BACKGROUND

In high speed (e.g., 10 giga bits per second (Gb/s)), high performance, serial communication receivers that require equalization, VGA and CTF are sometimes used on the front end of the topology. The VGA is used to either provide gain or attenuation depending on the amplitude of the input signal such that the VGA will output a substantially constant amplitude signal. The ability to adjust the gain/attenuation of the VGA so that both a very large and very small input voltage swing range at the input to the receiver can be accommodated is desirable for 10 Gb/s serial data communication applications.

Depending on the application, there are situations in which the minimum and maximum input swing range is so large that it is difficult to provide a VGA to cover the whole input dynamic range. Further, even when such a large input swing range can be covered, a total harmonic distortion (THD) of the VGA may not be adequate over at least some of the range, because of non-linearity of the gain. Therefore, it is desirable to design a VGA that accommodates a large input dynamic range while THD is kept at a low value. Further, it is desirable to reduce die areas and power for the VGA and CTF circuits.

SUMMARY OF THE INVENTION

In an exemplary embodiment of the present invention, an input processing circuit is provided. The input processing circuit includes a first input transistor for receiving a first input signal, and a second input transistor for receiving a second input signal. The first input signal and the second input signal are a differential pair of input signals. At least one resistor is coupled between a first terminal of the first input transistor and a first terminal of the second input transistor. A VGA circuit includes at least one first transistor having a gate terminal, and coupled between the first terminal of the first input transistor and the first terminal of the second input transistor; at least one second transistor having a gate terminal, and coupled between the first terminal of the first input transistor and the first terminal of the second input transistor; and a gate switch coupled to the gate terminal of the at least one second transistor. The at least one first transistor and the at least one second transistor adjust a gain of the input processing circuit in response to a control voltage. The control voltage is applied to the gate terminal of the at least one first transistor, and the control voltage is applied to the gate terminal of the at least one second transistor through the gate switch.

In another exemplary embodiment of the present invention, an input processing circuit for receiving a pair of differential input signals including a first input signal and a second input signal, and for generating a pair of differential output signals including a first output signal and a second output signal, is provided. The input processing circuit includes a first input transistor for receiving the first input signal, and a second input transistor for receiving the second input signal. At least one resistor is coupled between a first terminal of the first input transistor and a first terminal of the second input transistor. A VGA circuit has at least one transistor having a gate terminal, and is coupled between the first terminal of the first input transistor and the first terminal of the second input transistor. A CTF circuit for controlling a bandwidth of the pair of differential output signals includes a first plurality of capacitors coupled between the first output signal and a voltage source, and a second plurality of capacitors coupled between the second output signal and the voltage source.

In yet another exemplary embodiment of the present invention, an input processing circuit for receiving an input signal and generating an output signal is provided. The input processing circuit includes an input transistor having a first terminal, a second terminal and a third terminal, wherein the second terminal is used for receiving the input signal. A VGA circuit is coupled to the third terminal for controlling a gain of the input processing circuit. A CTF circuit is coupled to the first terminal for controlling a bandwidth of the input processing circuit, wherein the output signal is generated at the first terminal.

In still another exemplary embodiment of the present invention, an input processing circuit for receiving a pair of differential input signals including a first input signal and a second input signal, and for generating a pair of differential output signals including a first output signal and a second output signal, is provided. The input processing circuit includes a first input transistor having first, second, and third terminals, for receiving the first input signal at the second terminal, and a second input transistor having fourth, fifth and sixth terminals, for receiving the second input signal at the fifth terminal. A VGA circuit includes at least one first transistor having a gate terminal, and coupled between the third terminal and the sixth terminal, and at least one second transistor having a gate terminal, and coupled between the third terminal and the sixth terminal. A CTF circuit for controlling a bandwidth of the pair of differential output signals includes a first plurality of capacitors coupled between the first differential output and a voltage source, and a second plurality of capacitors coupled between the second differential output and the voltage source.

These and other aspects of the invention will be more readily comprehended in view of the discussion herein and accompanying drawings.

DETAILED DESCRIPTION

In an exemplary embodiment of the present invention, a gain control circuit for the VGA is provided. Using the gain control circuit, both small and large swing inputs can be accommodated (e.g., amplified or attenuated) for generating a substantially constant voltage output. The VGA output may then be sent to a CTF, which is used to process (e.g., "smooth out") the waveform by either increasing or decreasing the bandwidth as needed. The VGA and the CTF may be combined into a VGA-CTF combination cell according to exemplary embodiments of the present invention.

Figure 1:
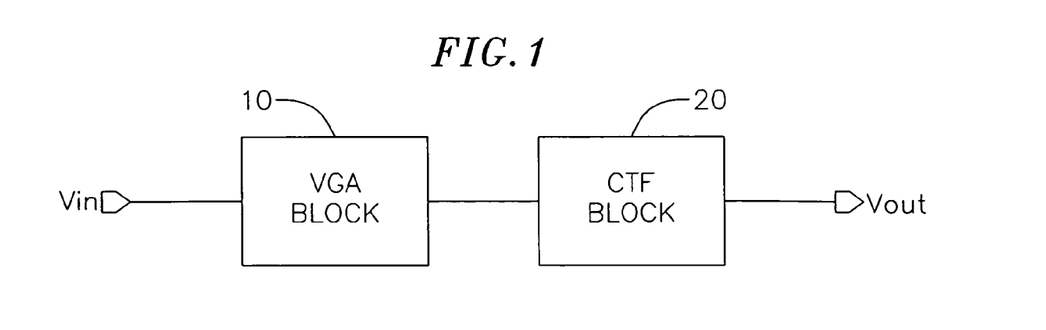
FIG. 1 is a block diagram of a VGA-CTF topology.

FIG. 1 shows that a VGA block 10 and a CTF block 20 are connected in a "series" configuration, in which the CTF block 20 follows the VGA block 10 in the signal path. In other words, the VGA block 10 receives a voltage input Vin, attenuates or amplifies it, and provides an output to the CTF block 20. The CTF block 20 receives the output of the VGA block 10, processes it to adjust bandwidth, and outputs a voltage output Vout.

Figure 2A:
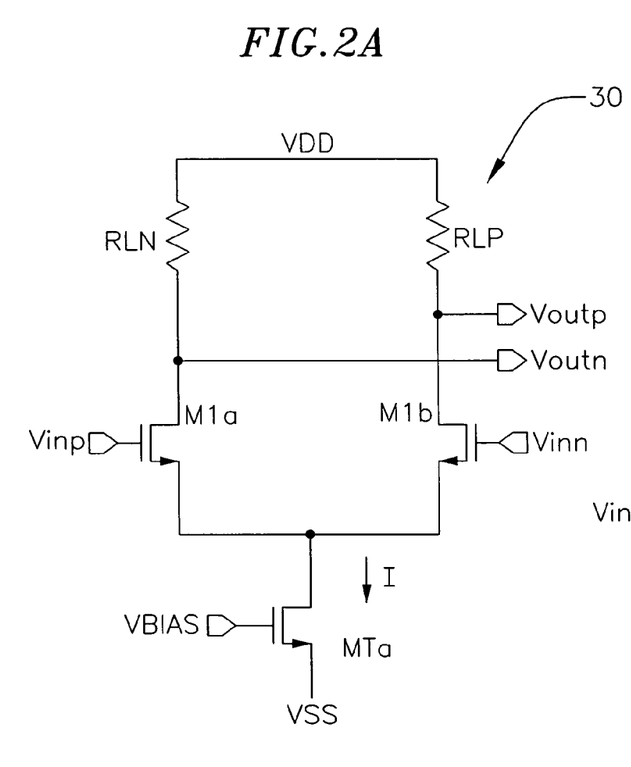
FIG. 2A is a classical current mode logic (CML) circuit.
Figure 2B:
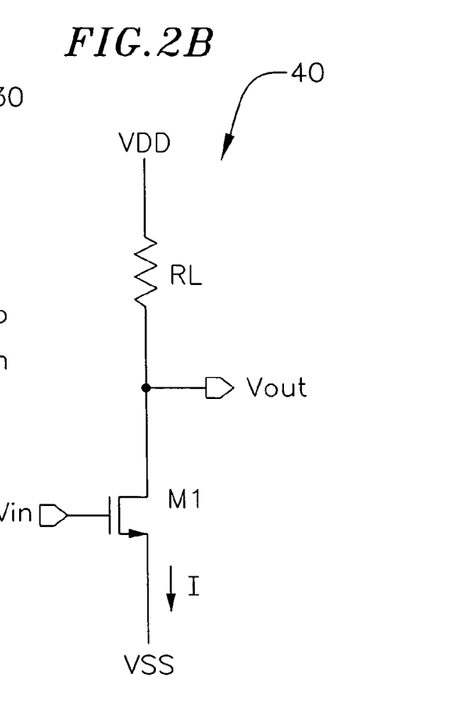
FIG. 2B is a half-circuit corresponding to the CML circuit of FIG. 2A.

A differential CML circuit 30 of FIG. 2A and a CML half-circuit 40 of FIG. 2B are used extensively in 10 Gb/s and higher data rate applications. The CML circuits of FIGS. 2A and 2B are foundation for the realization of a typical VGA cell or a CTF cell. The gain or transfer function equation for the classical CML circuit can be derived from the gain of the half-circuit of FIG. 2B, which is shown in Equation 1 below.

$$\text{gain} = \frac{Vout}{Vin} = gm_{M1} \cdot R_L \quad \text{(Eq. 1)}$$

Equation 1 shows that the gain of this circuit is directly proportional to the product of gm for a input transistor M1 and resistor load $R_L$ of the CML half-circuit 40.

Equation 2 below defines gm as being directly proportional to the square root of tail current I and the differential pair's W/L ratio. In Equation 2, K' is a process constant, which may be a product of gate oxide capacitance (Cox) and electron mobility constant μ.

$$gm = \sqrt{K' \cdot (W/L) \cdot I} \quad \text{(Eq. 2)}$$

As can be seen from the above Equations 1 and 2, there are several alternate parameters that can be used to adjust gain in the CML structure. As shown in a VGA circuit 50 of FIG. 3, one method for varying the gain is to vary the load resistance by placing NMOS transistors 51 and 51' in parallel with resistors RLN 52 and RLP 52', respectively, in the CML circuit. In the VGA circuit 50, input signals Vinp and Vinn are applied at gates of NMOS transistors 55 and 55', respectively, to generate outputs Voutn and Voutp, respectively. A variable voltage source 53 supplies a variable voltage Vcr, which is applied at gates of the transistors 51 and 51'. Hence, the load resistance can be varied by varying the Vcr voltage supplied by the variable voltage source 53.

Figures 3, 4:
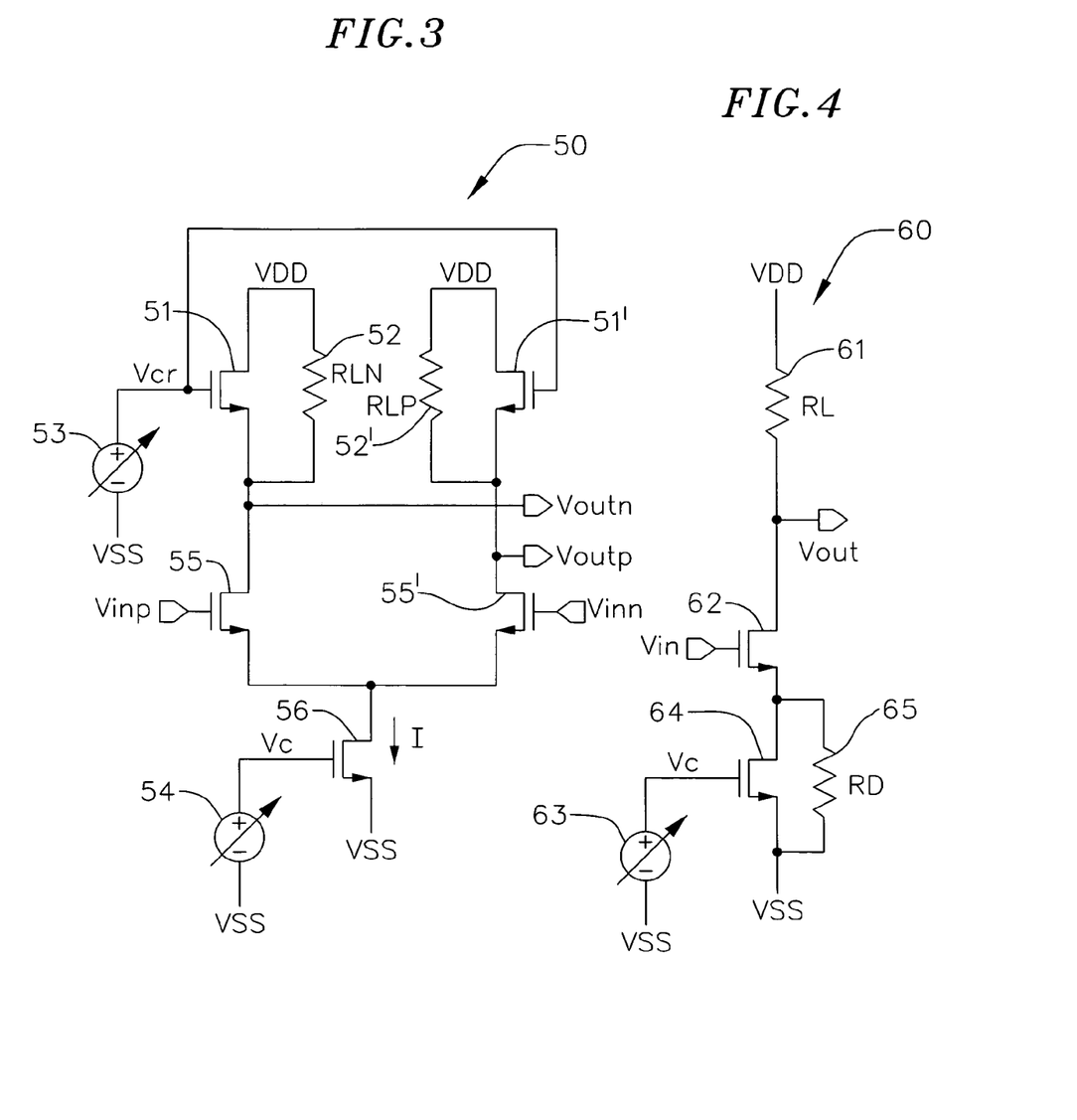
FIG. 3 is a VGA circuit based on a CML circuit, in which both the load resistance and the tail current I can be adjusted.
FIG. 4 is a VGA circuit based on a CML half-circuit, in which resistor degeneration has been implemented.

This method in and of itself would result in the output common-mode voltage to vary as well. Therefore, in order to avoid this, the tail current should be varied in addition to varying the resistance. This is indicated in FIG. 3 by an application of a variable voltage Vc supplied by a variable voltage source 54 at a gate of an NMOS transistor 56. However, this implementation would require having two different control voltages, namely, the variable voltage source 53 to supply the voltage Vcr for varying the load resistance, and the variable voltage source 54 to supply the variable voltage Vc for varying the tail current.

Another method for varying the gain is to implement resistor degeneration to adjust gain. The implementation of resistor degeneration on the classical CML circuit is shown in FIG. 4 as a VGA circuit 60. In the VGA circuit 60, an input Vin is applied at a gate of an NMOS transistor 62 to generate an output Vout. An effective degeneration resistance $R_{DEFF}$ is provided as a parallel combination of resistor $R_D$ 65 and the resistance of an NMOS transistor 64. A gate of the NMOS transistor 64 is coupled to a voltage output Vc of a variable voltage source 63. This way, the resistance across the NMOS transistor 64 can be varied by varying the voltage Vc. The resulting transfer function is shown in Equation 3a with Equation 3b defining $R_{DEFF}$.

$$\frac{Vout}{Vin} = \frac{gm \cdot R_L}{1 + gm \cdot R_{DEFF}} \quad \text{(Eq. 3a)}$$

$$R_{DEFF} = \frac{R_{ON} \cdot R_D}{R_{ON} + R_D} \quad \text{(Eq. 3b)}$$

As will be described later, the VGA in exemplary embodiments of the present invention is based on this type of resistor-degeneration structure. Here, $R_{ON}$ is the resistance of the NMOS transistor, which is variable in response to the variation of the voltage Vc.

Figure 5A:
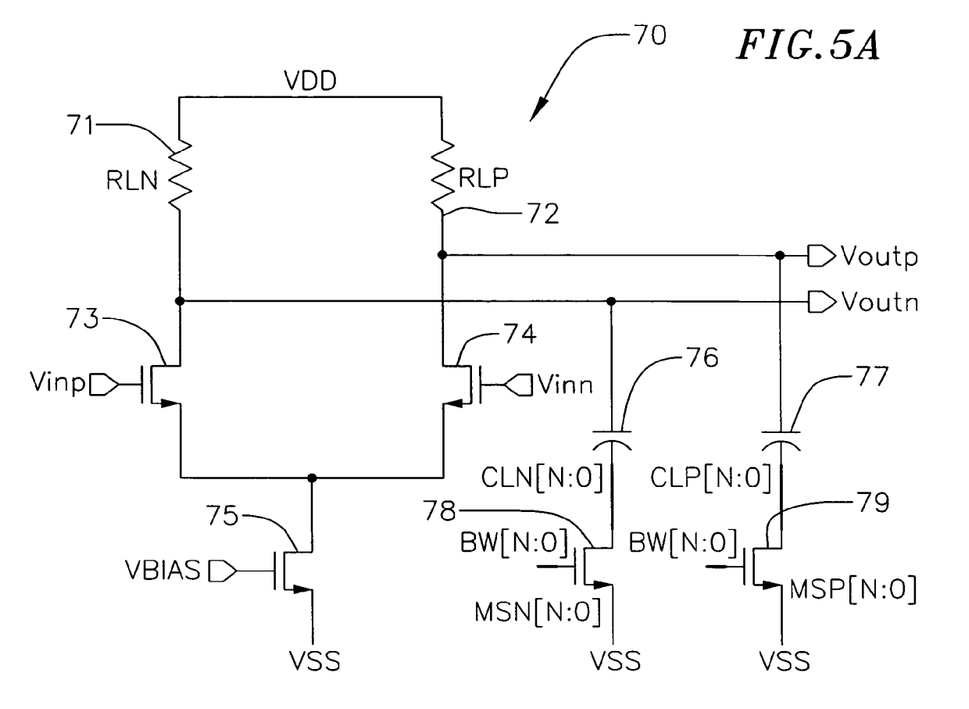
FIG. 5A is a CTF circuit based on a CML circuit.
Figure 5B:
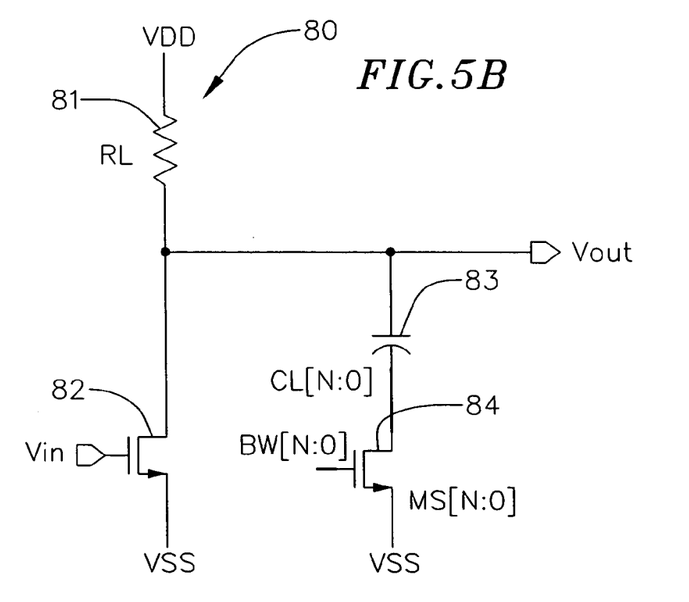
FIG. 5B is a half-circuit corresponding to the CTF circuit of FIG. 5A.

One technique of implementing a CTF cell is shown in FIG. 5A as a CTF circuit 70. FIG. 5B is a CTF half-circuit 80 corresponding to the CTF circuit 70. The CTF circuit 70 is a CML circuit with an array of N+1 programmable capacitors CLP[N:0] 77 connected in parallel at a positive output node Voutp and an array of N+1 programmable capacitors CLN[N:0] 76 connected in parallel at a negative output node Voutn, to set the bandwidth. The CLP[N:0] 77 and CLN[N:0] 76 receive an array of N+1 control signals over BW[N:0], which is a control bus having a bus width N+1.

The programmable capacitors 76 and 77 are coupled to a ground voltage VSS through switches MSN[N:0] 78 and switches MSP[N:0] 79, respectively. The CTF circuit 70 also includes load resistors 71, 72, input transistors 73, 74 and a current source transistor 75. The current source transistor 75 receives a bias voltage VBIAS at its gate. In one exemplary embodiment, N=14, for example. Hence, there are fifteen each of the programmable capacitors 76, 77 and the switches 78, 79. The number of programmable capacitors and switches may be the same or different in exemplary embodiments of the present invention.

Similar to the CTF circuit 70 of FIG. 5A, the CTF half-circuit 80 is a CML half-circuit with programmable capacitors CL[N:0] 83 connected at the output node Vout to set the bandwidth. The programmable capacitors 83 are coupled to a ground voltage VSS through switches MS[N:0] 84. The CTF circuit 80 has a load resistor $R_L$ 81 coupled to a supply voltage VDD. The CTF circuit 80 receives an input voltage Vin at a gate of an input transistor 82. The transfer function of the CTF half-circuit 80 is shown in Equation 4 below. In Equation 4, the capacitance $C_L$ is programmable through varying the number of capacitors CL[N:0] 83 that are connected to the ground voltage Vss by turning on the corresponding ones of the switches MS[N:0].

$$\frac{Vout}{Vin} = \frac{gm \cdot R_L}{1 + j\omega R_L C_L} \qquad (Eq.\ 4)$$

Figure 6A:
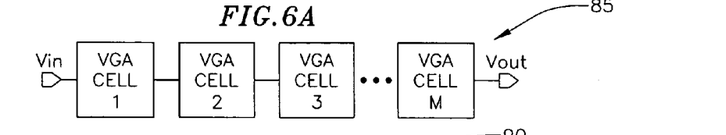
FIG. 6A shows cascaded VGA stages.
Figure 6B:
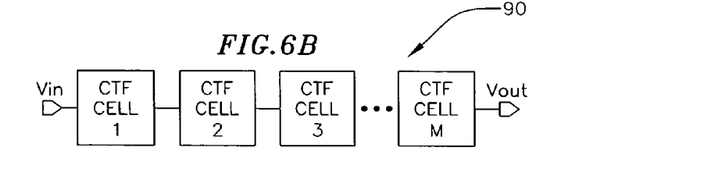
FIG. 6B shows cascaded CTF stages.
Figure 7A:
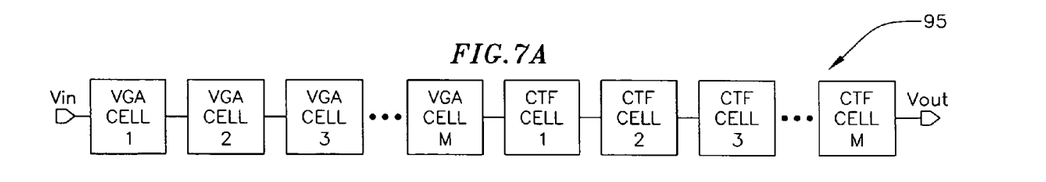
FIG. 7A shows cascaded VGA and CTF stages.

In a typical application that utilizes the VGA-CTF combination, it is not unusual (depending on the amount of gain or attenuation desired) to have several VGA stages cascaded one after another as shown as cascaded M VGA stages 85 in FIG. 6A. Similarly, for the CTF cell, depending on the bandwidth limitation desired, several CTF stages may be cascaded one after another as shown as cascaded M CTF stages 90 in FIG. 6B. As a result, a particular topology may have several stages of VGA and several stages of CTF cascaded one after another as shown as cascaded M VGA and M CTF stages 95 in FIG. 7A.

Figure 7B:
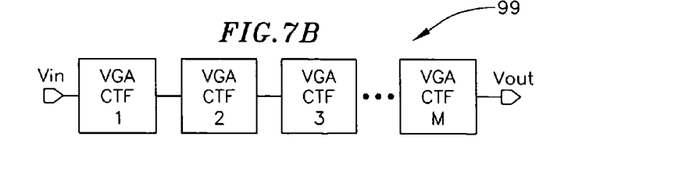
FIG. 7B shows cascaded VGA-CTF combination cells in an exemplary embodiment of the present invention.

FIG. 7B illustrates cascaded VGA-CTF combination cells 99 in an exemplary embodiment of the present invention. Each of the VGA-CTF combination cells shown in FIG. 7B includes circuitry for performing both VGA and CTF functions. The number of VGA-CTF combination cells can differ in different embodiments. For example, four VGA-CTF combination cells may be used in one particular embodiment. Further, only a single VGA-CTF combination cell may be used instead of a cascade of VGA-CTF combination cells. The VGA-CTF combination cell in FIG. 7B may have structure and operation that are substantially the same as one or more of the VGA-CTF combination cells shown in FIGS. 9–12.

In further exemplary embodiments of the present invention, a method has been implemented to control the gain of the VGA so that both very small and very large signal amplitudes at the input can be either amplified or attenuated such that the output to any subsequent circuit block will be substantially fixed in amplitude. In addition, by providing more than one gain modes (e.g., low gain mode and high gain mode), the input swing range over which the VGA operates in a linear region has been increased, thereby improving total harmonic distortion (THD) (i.e., reducing distortion). In other embodiments, more than two gain modes, such as three, may be used. In still other embodiments, multiple gain modes may also be used to extend the gain range of the VGA.

Figure 8A:
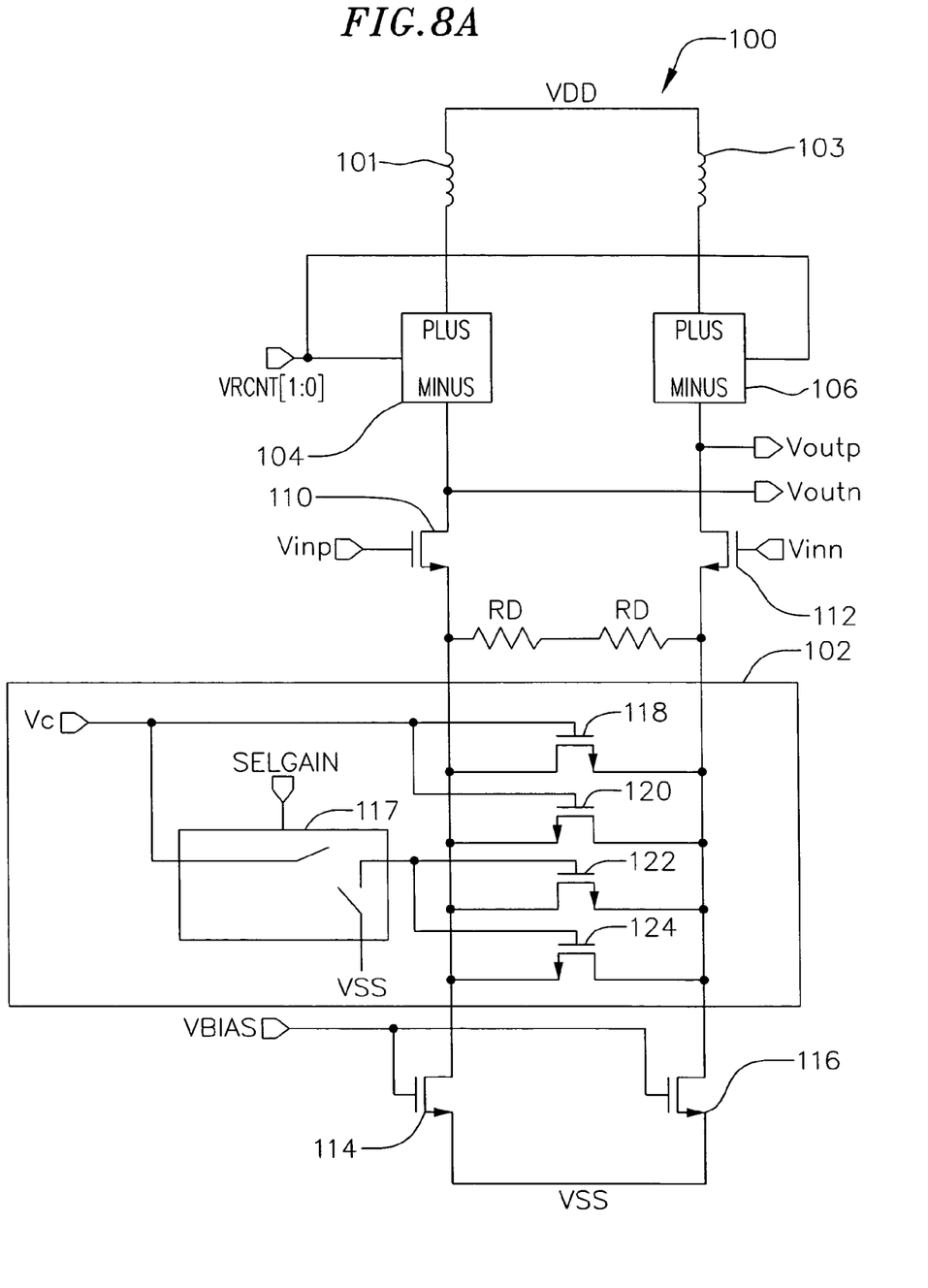
FIG. 8A is a VGA circuit in another exemplary embodiment of the present invention.

The implementation of the VGA circuit in exemplary embodiments of the present invention is shown in FIG. 8A. Referring now to FIG. 8A, a VGA circuit 100 includes a gain control circuit 102 and a pair of process-compensated resistors 104, 106. In other embodiments, resistors used may not be process-compensated resistors. The resistors 104 and 106 are coupled to a supply voltage VDD via shunt peaking inductors 101 and 103, respectively. The resistance of the resistors 104 and 106 are controlled by a control voltage input VRCNT[1:0]. The shunt peaking inductors 101 and 103 may not be used in other embodiments.

The VGA circuit 100 also includes a differential pair of input transistors 110 and 112 that are coupled in series with the resistors 104 and 106, respectively. A differential pair of voltage inputs Vinp and Vinn are coupled to gates of the input transistors 110 and 112, respectively, to generate a differential pair of outputs Voutn and Voutp, respectively. The input transistors 110 and 112 are NMOS transistors. In other embodiments, any other suitable transistors may be used as the input transistors and/or to replace any NMOS or PMOS transistors specified herein.

The sources of the input transistors 110 and 112 are coupled to drains of current source (NMOS) transistors 114 and 116, respectively, via the gain control circuit 102. The sources of the transistors 114 and 116 are coupled to a ground voltage VSS. Further, gates of the current source transistors 114 and 116 are coupled to a bias voltage VBIAS, which controls amount of the tail current in the VGA circuit 100.

Using the gain control circuit 102, the VGA circuit 100 can amplify or attenuate the input signals (i.e., Vinp and Vinn), such that a very large input swing range can be accommodated. The gain control circuit 102 includes two pairs of degeneration transistors, namely, NMOS transistors 118, 120 (a first pair) and 122, 124 (a second pair). The degeneration transistors 118, 120, 122 and 124 are coupled in parallel between the sources of the input transistors 110 and 112.

The degeneration transistors 118, 120, 122 and 124 are biased in the triode region, and are placed in parallel with the degeneration resistors $R_D$. The transistors 118, 120 and/or the transistors 122, 124 are sized to obtain the desired effective degeneration resistance $R_{DEFF}$. This parallel combination is used as the "variable resistor" which is the mechanism by which the gain is changed. Thus, increasing the voltage applied to the transistors 118, 120 and/or 122, 124 results in increasing the resultant DC gain of the VGA circuit 100. Conversely, decreasing the voltage applied to the transistors 118, 120 and/or 122, 124 results in decreasing the DC gain of the VGA circuit 100.

While gates of all four degeneration transistors can receive a control voltage Vc, a transfer gate switch 117 is coupled between the control voltage Vc and the gates of the degeneration transistors 122 and 124. The transfer gate switch 117 alternatively couples the gates of the second pair of degeneration transistors 122 and 124 between the control voltage Vc and the ground voltage VSS in response to a gain selection signal SELGAIN. In other words, the transfer gate switch 117 is able to change the operational mode between a "low gain mode" and a "high gain model" based on the gain selection signal SELGAIN.

By way of example, when there is a very small signal swing at the input (i.e., the input voltages Vinp and Vinn) to the receiver, then the high gain mode would be selected. The high gain mode configuration is when all four degeneration transistors 118, 120, 122 and 124 are connected to the control voltage Vc. In the high gain mode, hence, the transfer gate switch 117 couples the transistors 122 and 124 to the control voltage Vc in response to the corresponding SELGAIN signal level. Further, when a large signal swing is present at the input to the receiver, then the "low gain mode" would be selected in response to the corresponding SELGAIN signal level. The signal levels for the SELGAIN for the high gain mode and the low gain mode would depend on the design of the VGA circuitry, and in particular to the design of the transfer gate switch 117. For example, the SELGAIN signal of 0 may indicate low gain while the SELGAIN signal of 1 may indicate high gain.

In the low gain mode configuration, only two degeneration transistors, namely, 118 and 120, are connected to the control voltage node Vc. The other two degeneration transistors are connected to VSS and thus disabled. Therefore, the VGA circuit 100 is essentially divided into two bands of operation, namely, the low gain band and the high gain band.

Changing the analog voltage Vc applied to the gate node of the transistors 118, 120 and/or 122, 124 will result in an effective change in resistance $R_{DEFF}$. This change in resistance $R_{DEFF}$ results in a change in the DC gain of the VGA cell as shown in the Equations 3a and 3b. Hence, the VGA circuit provides the capability of varying the DC gain. In addition, the size (e.g., W/L) of the transistors may be adjusted during fabrication to change the DC gain of the VGA cell.

The gain ranges in the high gain mode and the low gain mode may overlap. For example, the low gain range may be between −20 dB and +25 dB, while the high gain range may be between −20 dB and +38 dB. Even though the gain range for the low gain range is a subset of the gain range for the high gain range in this particular example, the VGA 100 may have poor THD (e.g., high distortion) near the low end of the gain range in the high gain mode, and therefore, the low gain mode may be used instead for low gain. For example, the high gain mode may have poor THD when the gain falls below approximately 9 dB. In other embodiments, the gain range of the low gain mode may not fall completely within the gain range of the high gain mode. In still other embodiments, the low gain mode or the high gain mode may begin to have poor THD at different gains within the respective gain ranges.

In the gain control circuit 102, two parallel transistors (i.e., degeneration transistors) 118 and 120 are used during the low gain mode, and four parallel transistors 118, 120, 122 and 124 are used during the high gain mode. In other embodiments, only one transistor may be used during the low gain mode, and two transistors may be used during the high gain mode.

Another element which influences the DC gain is the resistor load (i.e., resistors 104 and 106). Since the resistor load is not an ideal element, the value of resistance will typically vary significantly across process corners. This variation in resistance value may significantly impact the performance of the VGA circuit across process variations to the point at which a desired design parameter may no longer be met.

To address the process variations, the VGA circuit 100 of FIG. 8A includes the process-compensated resistors 104 and 106 instead of conventional resistors. The resistance across the resistors 104 and 106 can be varied by changing the voltage level of the VRCNT[0:1] signal applied to the resistors 104 and 106, respectively. Hence, the process-compensated resistors 104 and 106 are used to minimize performance variations across process.

Figure 8B:
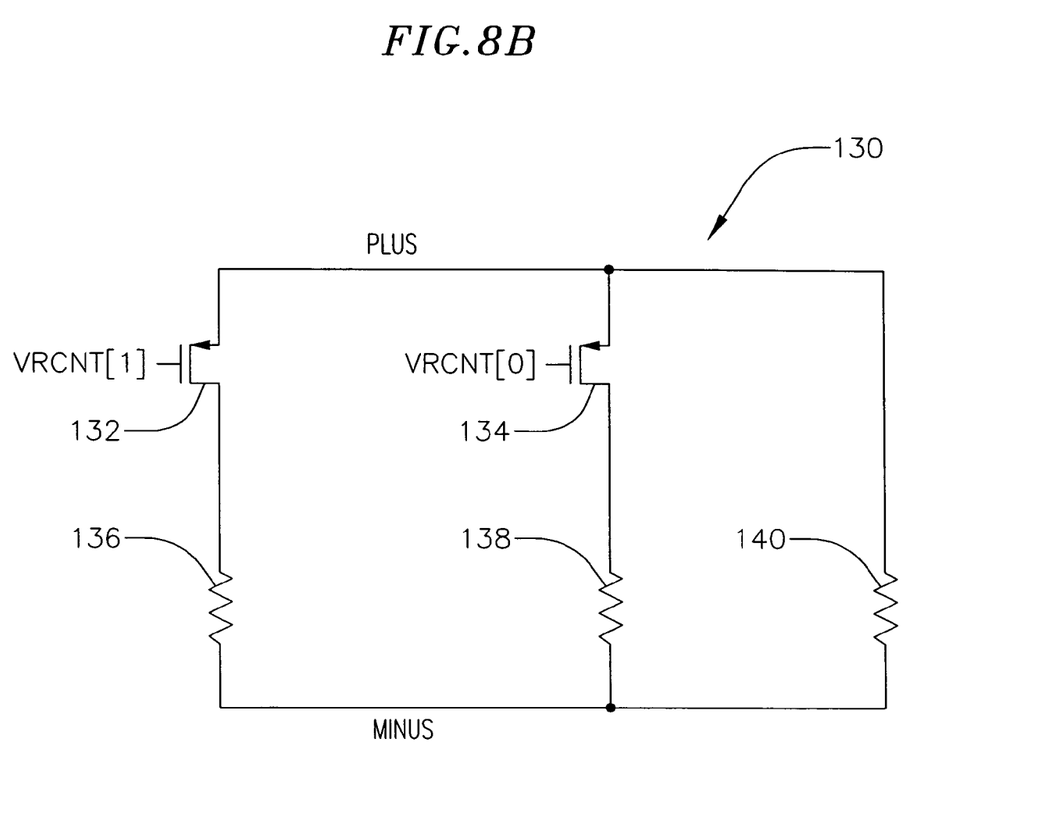
FIG. 8B is a process-compensated resistor in the VGA circuit of FIG. 8A.

FIG. 8B is a process-compensated resistor circuit 130, which may be used as any of the resistors 104 and 106, or as any other process-compensated resistors in the present application. The process-compensated resistor 130 includes control transistors 132 and 134 that are arranged in parallel. The control transistors 132 and 134 of FIG. 8B are PMOS transistors whose sources are coupled to a plus side, while the drains are coupled through load resistors 136 and 138, respectively, to a minus side. Another load resistance 140 is coupled in parallel to the control transistors 132 and 134 between the plus side and the minus side. By way of example, when the value of the load resistance 140 is $R_L$, the value of the load resistors 136 and 138 may be 10×$R_L$ and 20×$R_L$, respectively.

This process-compensated resistor load structure essentially reduces the resistor process variation, which significantly eases the design optimization requirements of the rest of the VGA-CTF combination cell elements. Details of the Process-Compensated Resistor Load circuit can be found in a commonly owned patent application entitled "Resistor Compensation Apparatus", U.S. patent application Ser. No. 10/840,524 filed May 6, 2004, the entire content of which is incorporated by reference herein.

In other exemplary embodiments of the present invention, the VGA and CTF circuit functions are combined into one CML-type unit cell in such a way as to reduce or minimize the number of total stages needed to perform both functions as well as reduce or minimize the power dissipated by the resultant reduction in the total amount of stages. The combination of VGA and CTF into one cell also reduces die area, which makes it cheaper to manufacture. One such VGA-CTF combination cell in an exemplary embodiment was introduced above in reference to FIG. 7B.

Figure 9:
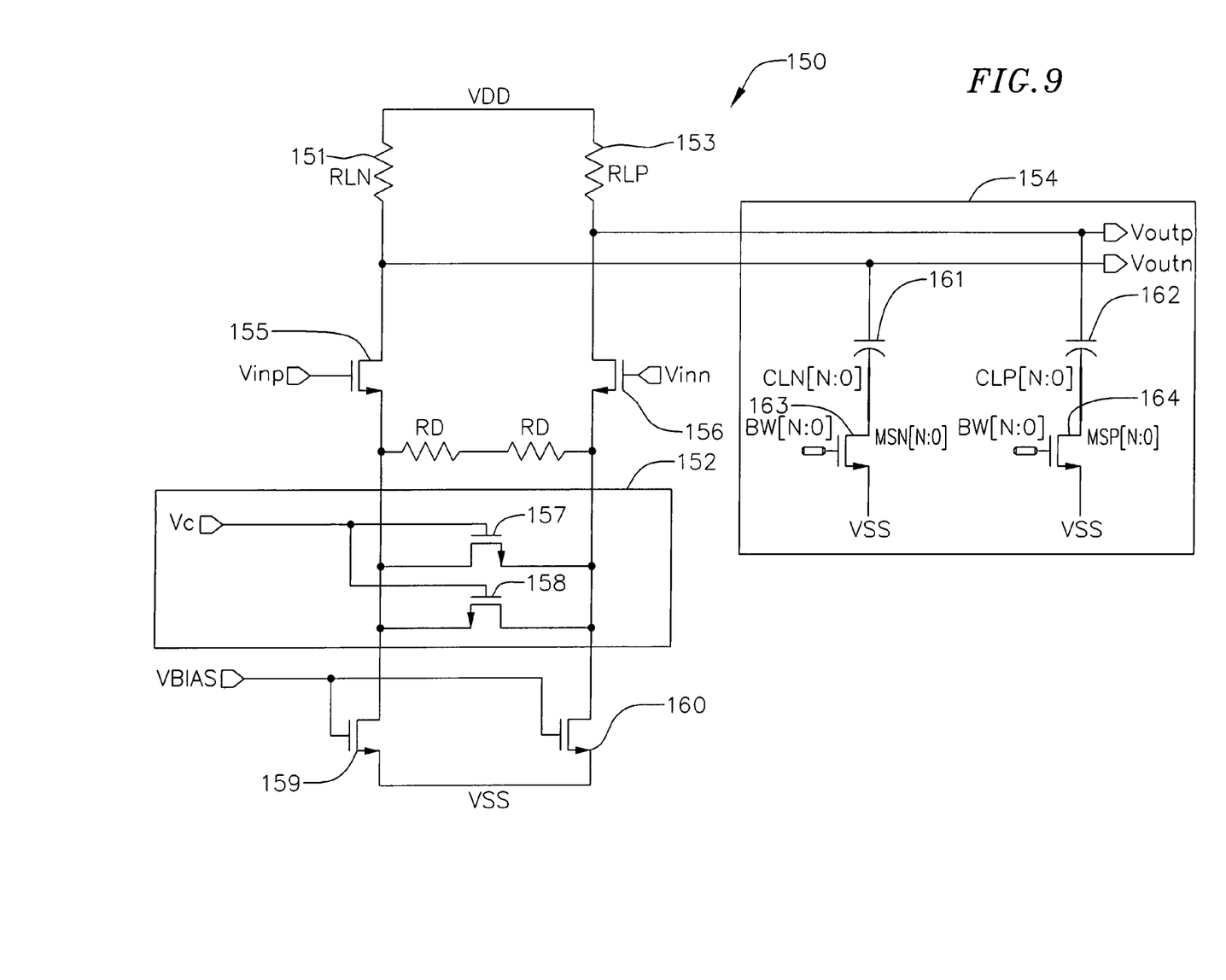
FIG. 9 is a VGA-CTF combination cell in yet another exemplary embodiment of the present invention.

FIG. 9 is a circuit diagram of a VGA-CTF combination cell 150 in another exemplary embodiment of the present invention. The VGA-CTF combination cell 150 has a gain control circuit (i.e., VGA portion) 152 and a bandwidth control circuit (i.e., CTF portion) 154. Instead of the four degeneration transistors found in the gain control circuit 102 of FIG. 8A, the gain control circuit 152 includes two degeneration transistors (NMOS transistors) 157 and 158 that are coupled in parallel between sources of input (NMOS) transistors 155 and 156, respectively. Gates of the transistors 157 and 158 receive a control voltage Vc, which may be an analog voltage signal.

Gates of the input transistors 155 and 156 receive a differential pair of input voltage signals Vinp and Vinn, respectively, to generate respective outputs Voutn and Voutp. A pair of load resistors 151 and 153 are coupled between a supply voltage VDD and the outputs Voutn and Voutp, respectively. The input transistors 155 and 156, resistors RD and current source transistors 159 and 160 are coupled and biased in substantially the same way as the corresponding components of the VGA circuit 100 of FIG. 8A, and will not be discussed in detail. The gain of the VGA-CTF combination cell 150 is controlled by varying the control voltage Vc.

The outputs Voutn and Voutp are coupled to a ground voltage VSS via programmable capacitors CLN[N:0] 161 and CLP[N:0] 162, respectively, of the bandwidth control circuit 154. Each of CLN[N:0] and CLP[N:0] is an array of N+1 parallel capacitors. The capacitors CLN[N:0] 161 and CLP[N:0] 162 are coupled in series with transfer gates MSN[N:0] 163 and MSP[N:0] 164, respectively. The transfer gates MSN[N:0] 163 and MSP[N:0] 164 are controlled using a thermometer decoded output bus of width [N:0] shown as BW[N:0] in FIG. 9. In other words, N+1 transfer gates are opened and closed using N+1 thermometer decoded control signals provided over the BW[N:0]

The thermometer decoded output bus is connected to a total of N+1 transfer gates acting as logic switches which connect/disconnect capacitors CLN[N:0] 161 and CLP[N:0] 162 to/from the ground voltage VSS. When N=14, for example, the number of capacitor elements in each of the capacitor arrays CLN[N:0] 161 and CLP[N:0] 162 is 15. Correspondingly, there are 15 transfer gates in each of MSN[N:0] 163 and MSP[N:0] 164. In the thermometer decoded output bus BW[N:0], only one of the N+1 bits switches (i.e., from 0 to 1 or 1 to 0) at a time. In other embodiments, multiple bits on the bus BW[N:0] may change state at a time.

A logic state of "all ones" results in all the capacitors being "connected" which maximizes the amount of capacitance at the output nodes, resulting in the minimum bandwidth setting. Conversely, a logic state of "all zeros" results in all the capacitors being "disconnected" which minimizes the total capacitance at the output nodes, resulting in the maximum bandwidth setting.

In the exemplary embodiment of FIG. 9, because the capacitors used are not ideal, there may be some finite amount of parasitic capacitance that cannot be totally eliminated just by "switching off" the transfer gates. Thus, the parasitic capacitance will typically be connected to the output nodes. Therefore, even though the minimum amount of capacitance is desired, which should result in the maximum amount of bandwidth, depending on the application, this "maximum" bandwidth may still be lower than that of the design target as is often the case for 10 GB/s and higher data rate applications using "state of the art" CMOS process technology. Depending on how much the resultant "maximum" bandwidth is short of the design goal, this obstacle may be overcome by reducing the resistor load $R_L$, increasing the tail current I, reducing the W/L ratio of the differential pair, or some combination of two or more of the above.

However, a bandwidth extension technique using optimized on-chip inductors may allow an extension of the 3 dB bandwidth by as much as 85% without having to resort too much to the techniques mentioned above. A usage of such on-chip inductors is described in a publication entitled "Bandwidth Extension in CMOS with Optimized On-Chip Inductors," IEEE Journal of Solid-State Circuits, Vol. 35, No. 3, pages 346–355, March 2000, by S. Mohan, et. al., the entire content of which is incorporated by reference herein. This modification to the VGA-CTF cell circuit called "shunt peaking" is shown in FIGS. 8A and 10–12.

Figure 10:
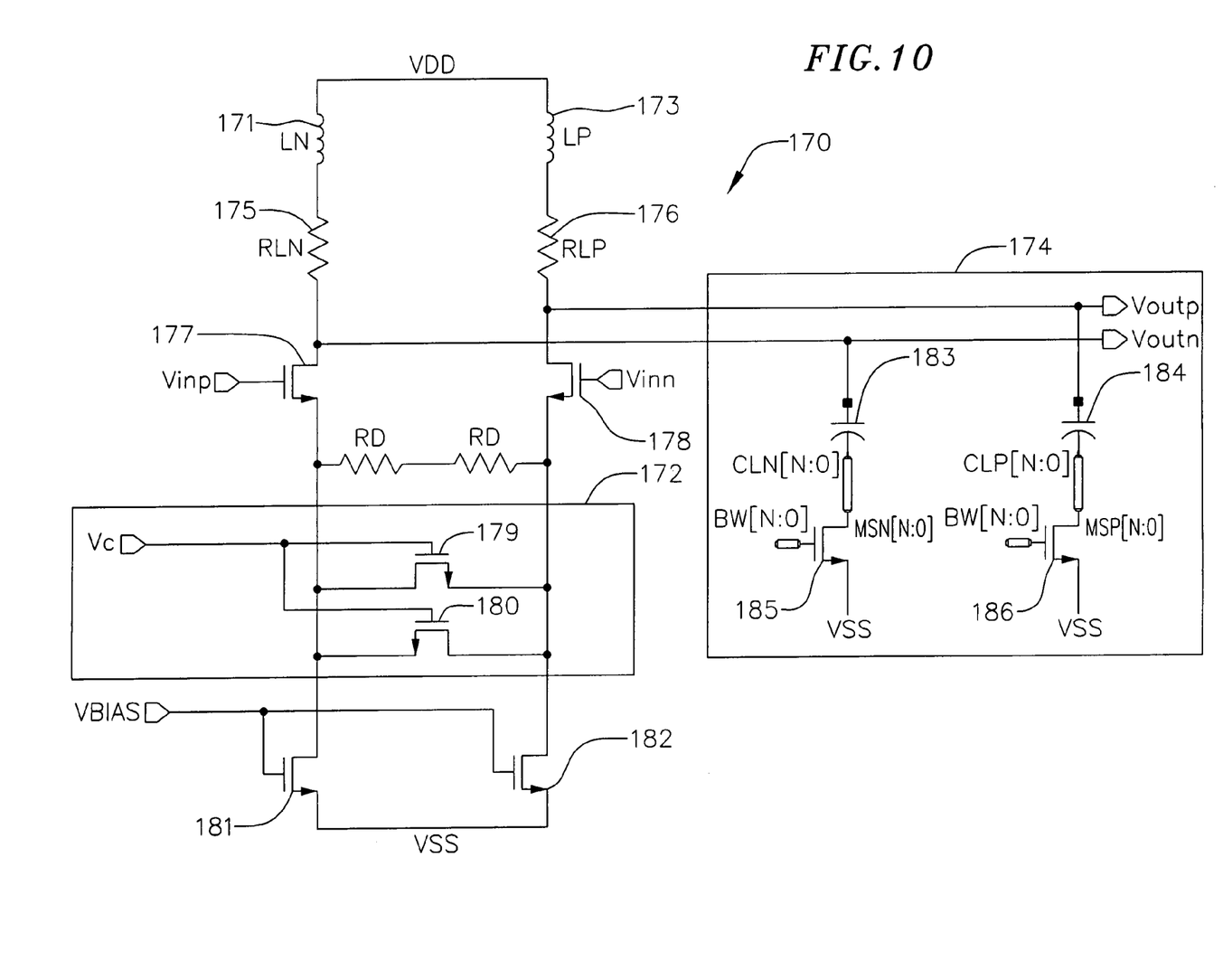
FIG. 10 is a VGA-CTF combination cell having shunt-peaking inductors in yet another exemplary embodiment of the present invention.

A VGA-CTF combination cell 170 of FIG. 10 is similar to the VGA-CTF combination cell 150 of FIG. 9. A voltage control circuit 172 of the VGA-CTF combination cell 170 includes a pair of degeneration transistors 179 and 180 in parallel, and is substantially the same as the voltage control circuit 152 of the VGA-CTF combination cell 150 of FIG. 9. Similarly, a bandwidth control circuit 174 of the VGA-CTF combination cell 170 includes capacitors CLN[N:0] 183 and CLP[N:0] 184, and transfer gates (NMOS transistors) MSN[N:0] 185 and MSP[N:0] 186, and is substantially the same as the bandwidth control circuit 154 of FIG. 9. The VGA-CTF combination cell 170 has a pair of shunt peaking inductors 171 and 173 between the VDD and the load resistors 175 and 176, respectively.

The zero in the transfer function of the VGA-CTF combination cell 170 is determined by the L/R time constant and is primarily responsible for the bandwidth enhancement due to shunt peaking. The frequency response is characterized by the ratio of the L/R and an RC time constant also known as "m" so that $L=mR^2C$. An m=0.4 yields a "maximally flat" frequency response which results in an increase in the 3 dB frequency by a factor of about 70%.

Figure 11:
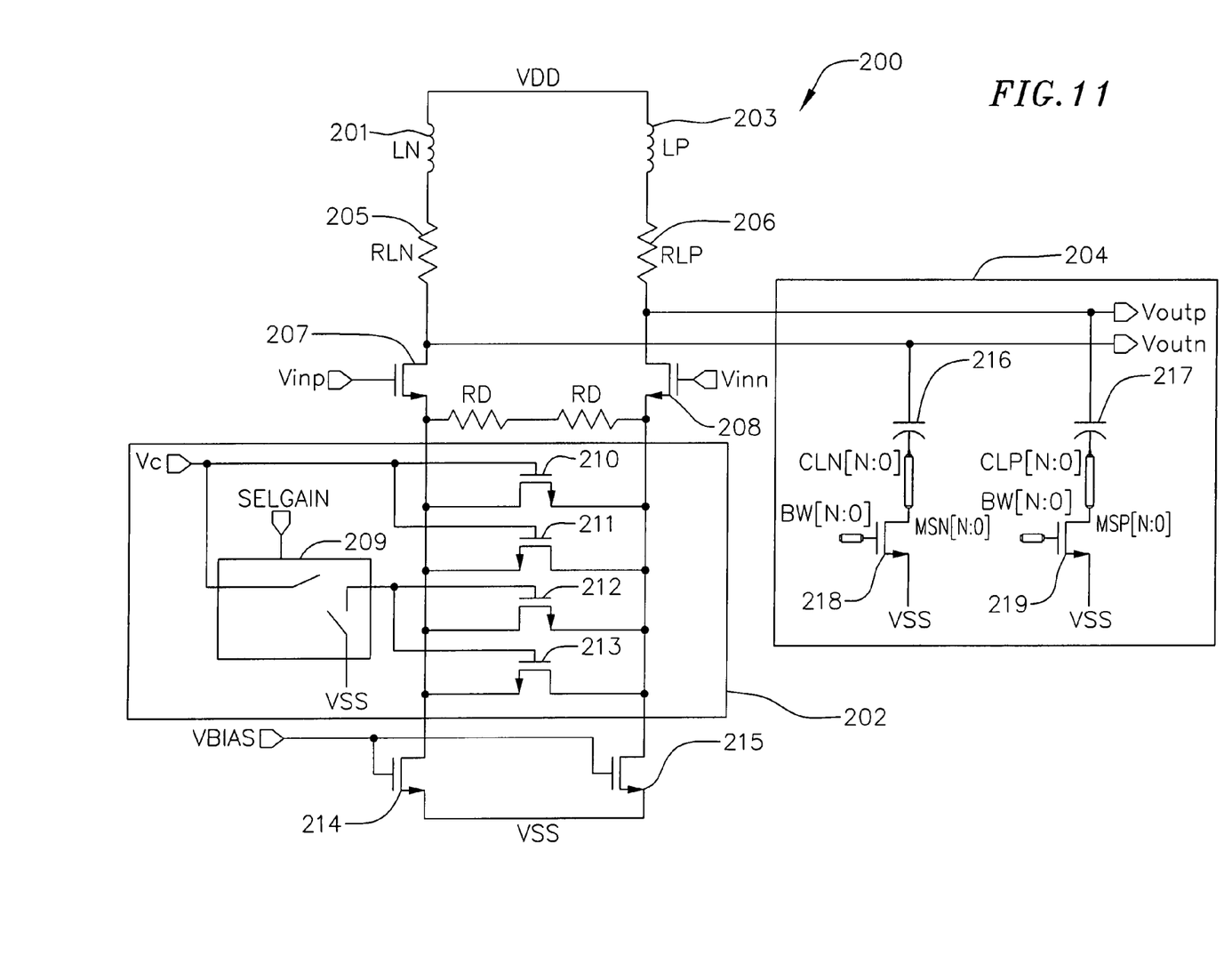
FIG. 11 is a VGA-CTF combination cell in yet another exemplary embodiment of the present invention.

A VGA-CTF combination cell 200 with shunt-peaking inductors 201 and 203 of FIG. 11 has a voltage control circuit 202, which includes a transfer gate switch 209 and degeneration transistors 210, 211, 212, 213. The voltage control circuit 202 is substantially the same as the voltage control circuit 102 of FIG. 8A. Also, a bandwidth control circuit 204 of the VGA-CTF combination cell 200 includes capacitors CLN[N:0] 216, CLP[N:0] 217 and transfer gates MSN[N:0] 218, MSN[N:0] 219, and is substantially the same as the bandwidth control circuit 154 of FIG. 9.

Further, the rest of the circuit components, namely, load resistors 205, 206, input transistors 207, 208, resistors $R_D$, and current source transistors 214, 215, are substantially the same as corresponding components of the VGA-CTF combination cell 150 of FIG. 9 and the VGA-CTF combination cell 170 of FIG. 10. Hence, the structure or the operation of the VGA-CTF combination cell 200 will not be described in detail herein. Similar to the VGA circuit 100 of FIG. 8A, the VGA-CTF combination cell 200 is capable of switching between high and low gain modes responsive to a gain selection signal SELGAIN.

Figure 12:
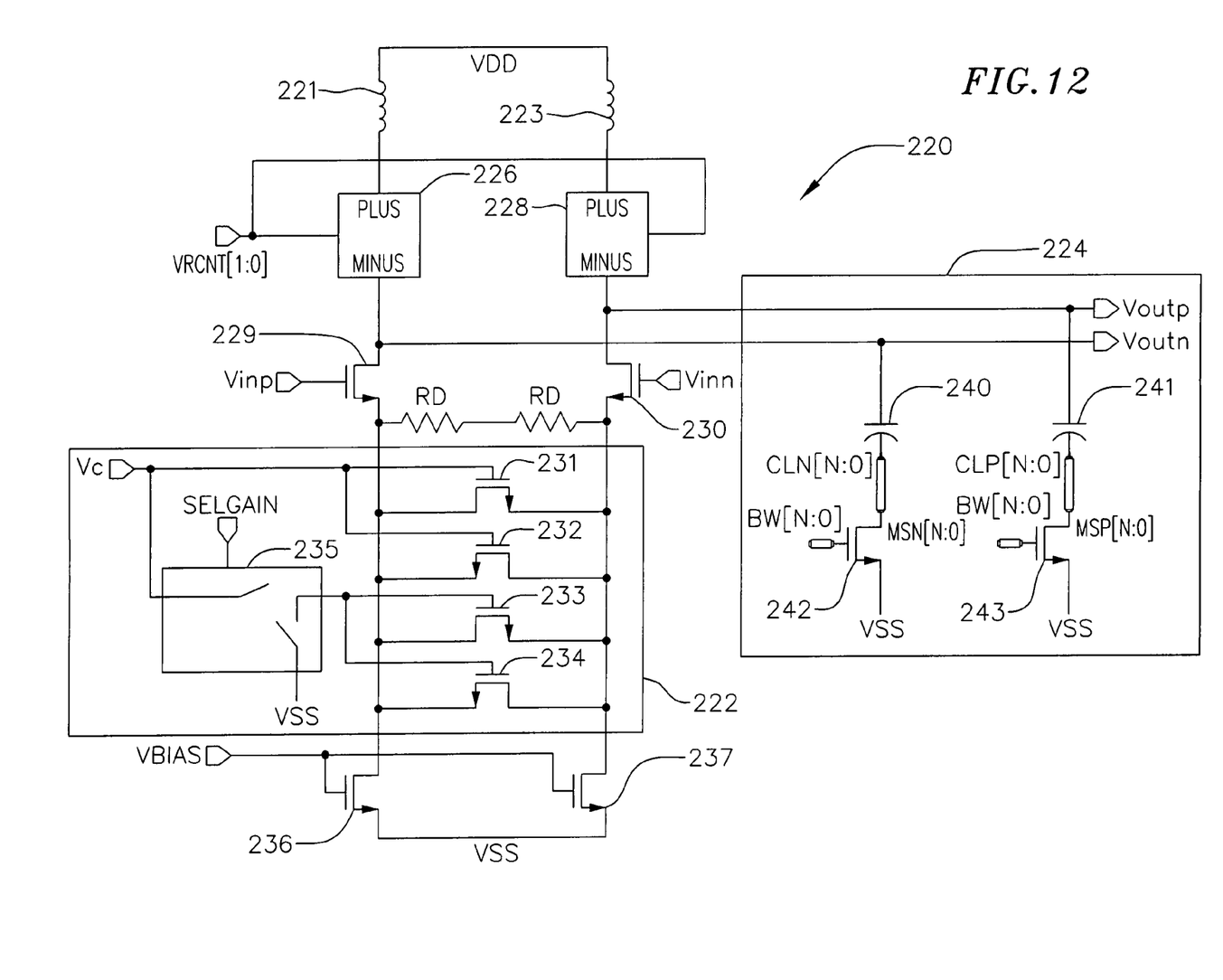
FIG. 12 is a VGA-CTF combination cell in yet another exemplary embodiment of the present invention.

In yet another exemplary embodiment of the present invention, shunt peaking (for increasing the resultant bandwidth) is provided in addition to process-compensated resistors (to reduce or minimize resistor process variations) in a VGA-CTF combination cell 220 as shown in FIG. 12. The VGA-CTF combination cell 220 of FIG. 12 is substantially the same as the VGA-CTF combination cell 200 of FIG. 11, except that the VGA-CTF combination cell 200 has a pair of process-compensated resistors 226 and 228 instead of the load resistors 205 and 206 of FIG. 11. The structure and operation of the process-compensated resistors 226 and 228 are substantially the same as those of the process-compensated resistors 104 and 106 of FIG. 8A and the process-compensated resistor 130 of FIG. 8B.

The VGA-CTF combination cell 220 also includes a voltage control circuit 222, which includes a transfer gate switch 235 and four parallel degeneration transistors 231, 232, 233 and 234. The VGA-CTF combination cell 222 is substantially the same as the voltage control circuit 202 of FIG. 11. The VGA-CTF combination cell 220 also includes shunt peaking resistors 221, 223, input transistors 229, 230, current source transistors 236, 237, and a bandwidth control circuit 224. The bandwidth control circuit 224 includes capacitors CLN[N:0] 240, CLP[N:0] 241 and transfer gates MSN[N:0] 242, MSN[N:0] 243, and is substantially the same as the bandwidth control circuit 204 of FIG. 11. Hence, the structure and operation of the VGA-CTF combination cell 220 will not be described in detail.

Hence, in the exemplary embodiments of the present invention, a control voltage method which essentially allows VGA "banding" for gain and/or improved THD is provided. Also, an addition of shunt peaking and/or resistor compensation to VGA cell is provided. Further, a combination of VGA and CTF cells is provided.

While certain exemplary embodiments have been described above in detail and shown in the accompanying drawings, it is to be understood that such embodiments are merely illustrative of and not restrictive of the broad invention. It will thus be recognized that various modifications may be made to the illustrated and other embodiments of the invention described above, without departing from the broad inventive scope thereof. In view of the above it will be understood that the invention is not limited to the particular embodiments or arrangements disclosed, but is rather intended to cover any changes, adaptations or modifications which are within the scope and spirit of the invention as defined by the appended claims.

For example, while the VGA and CTF circuits in the described exemplary embodiments primarily contain NMOS transistors, the VGA and CTF circuits in other embodiments may contain PMOS transistors or any other suitable transistors and/or switching devices to implement equivalent circuitry.

We claim:
1. An input processing circuit comprising:
   a first input transistor for receiving a first input signal;
   a second input transistor for receiving a second input signal, wherein the first input signal and the second input signal are a differential pair of input signals;

at least one resistor coupled between a first terminal of the first input transistor and a first terminal of the second input transistor; and a variable gain amplifier (VGA) circuit comprising:
- at least one first transistor having a gate terminal, and coupled between the first terminal of the first input transistor and the first terminal of the second input transistor;
- at least one second transistor having a gate terminal, and coupled between the first terminal of the first input transistor and the first terminal of the second input transistor; and
- a gate switch coupled to the gate terminal of the at least one second transistor, wherein the at least one first transistor and the at least one second transistor adjust a gain of the input processing circuit in response to a control voltage, and wherein the control voltage is applied to the gate terminal of the at least one first transistor, and the control voltage is applied to the gate terminal of the at least one second transistor through the gate switch.

2. The input processing circuit of claim 1, wherein the input processing circuit operates in a first gain mode when the gate switch is turned off, and wherein the input processing circuit operates in a second gain mode when the gate switch is turned on.

3. The input processing circuit of claim 1, wherein a second terminal of the first input transistor and a second terminal of the second input transistor are coupled to a supply voltage through a first load resistor and a second load resistor, respectively.

4. The input processing circuit of claim 3, wherein the second terminal of the first input transistor and the second terminal of the second input transistor are coupled to the supply voltage through a first inductor and a second inductor, respectively, in addition to the first load resistor and the second load resistor, respectively.

5. The input processing circuit of claim 3, wherein each of the first load resistor and the second load resistor is a process compensated resistor.

6. The input processing circuit of claim 1, generating a pair of differential outputs, and further comprising a continuous time filter (CTF) circuit coupled to the pair of differential outputs.

7. The input processing circuit of claim 6, wherein the CTF circuit comprises:
- a first plurality of capacitors coupled between a first one of the differential outputs and a voltage source; and
- a second plurality of capacitors coupled between a second one of the differential outputs and the voltage source.

8. The input processing circuit of claim 7, wherein each of the first plurality of capacitors is coupled through one of a first plurality of switches to the voltage source, and each of the second plurality of capacitors is coupled through one of a second plurality of switches to the voltage source.

9. The input processing circuit of claim 8, wherein each of the first plurality of switches and each of the second plurality of switches is turned off and on responsive to a corresponding one of a plurality of control signals, thereby controlling bandwidth of the input processing circuit.

10. The input processing circuit of claim 9, wherein the control signals are thermometer decoded outputs.

11. The input processing circuit of claim 7, wherein the voltage source provides ground.

* * * * *